(12) United States Patent
Coban

(10) Patent No.: US 11,646,722 B2
(45) Date of Patent: May 9, 2023

(54) CLOCK GENERATOR CIRCUIT FOR GENERATING DUTY CYCLE CLOCK SIGNALS AT LOW POWER

(71) Applicant: Silicon Laboratories Inc., Austin, TX (US)

(72) Inventor: Abdulkerim L. Coban, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 274 days.

(21) Appl. No.: 17/195,713

(22) Filed: Mar. 9, 2021

(65) Prior Publication Data

US 2022/0294429 A1   Sep. 15, 2022

(51) Int. Cl.
  *H03F 3/189*  (2006.01)
  *H03K 3/037*  (2006.01)
  *H03K 19/20*  (2006.01)

(52) U.S. Cl.
  CPC .......... *H03K 3/037* (2013.01); *H03F 3/189* (2013.01); *H03F 2200/294* (2013.01); *H03F 2200/451* (2013.01); *H03K 19/20* (2013.01)

(58) Field of Classification Search
  CPC .............................. H03F 3/189; H03K 3/037
  USPC .................................................. 330/307, 305
  See application file for complete search history.

(56) References Cited

U.S. PATENT DOCUMENTS

| | | | |
|---|---|---|---|
| 6,970,496 B1* | 11/2005 | Ben-Bassat ....... | H04L 25/03834 375/141 |
| 9,083,354 B2 | 7/2015 | Islam et al. | |
| 10,461,787 B2 | 10/2019 | Matthews et al. | |
| 11,496,119 B1* | 11/2022 | Kitani ................. | H03F 3/45475 |
| 11,545,980 B1* | 1/2023 | Lee ......................... | H04L 25/49 |
| 2022/0232186 A1* | 7/2022 | Oh ......................... | H03K 19/20 |
| 2022/0247391 A1* | 8/2022 | Li ......................... | G11C 19/28 |
| 2022/0321126 A1* | 10/2022 | Ou ......................... | H03K 3/037 |
| 2022/0337231 A1* | 10/2022 | Hwang ............. | H03K 3/356121 |
| 2022/0393687 A1* | 12/2022 | Wu ....................... | H03K 21/10 |

OTHER PUBLICATIONS

U.S. Appl. No. 17/160,835, filed Jan. 28, 2021 entitled "System, Apparatus and Method for Mitigating Digital Interference Within Radio Frequency Circuitry," by Thomas Saroshan David, et al.

Aliakbar Homayoun, et al., "A Low-Power CMOS Receiver for 5 GHz WLAN," IEEE Journal of Solid State Circuits, vol. 50, No. 3, Mar. 2015, 14 pages total.

(Continued)

*Primary Examiner* — Henry Choe
(74) *Attorney, Agent, or Firm* — Trop, Pruner & Hu, P.C.

(57) ABSTRACT

In one embodiment, an apparatus includes a clock generator circuit to receive a first clock signal at a first frequency and output a second clock signal at a second frequency less than the first clock frequency. The clock generator circuit may include: a divider circuit to divide the first clock signal to obtain at least a first divided clock signal and a second divided clock signal; and a gating circuit coupled to the divider circuit, the gating circuit to gate the first clock signal with at least one of the first divided clock signal and the second divided clock signal to output the second clock signal.

20 Claims, 7 Drawing Sheets

(56) References Cited

OTHER PUBLICATIONS

Ahmad Mirzaei, et al., "Analysis and Optimization of Direct-Conversion Receivers With 25% Duty-Cycle Current-Driven Passive Mixers," IEEE Transactions on Circuits and Systems—I: Regular Papers, vol. 57, No. 9, Sep. 2010, 14 pages total.

Bart J. Thijssen, et al., "A 370μW 5.5dB-NF BLE/BT5.0/IEEE 802.15.4—Compliant Receiver with >63dB Adjacent Channel Rejection at >2 Channels Offset in 22nm FDS01," ISSCC 2020 / Session 30 / Efficient Wireless Connectivity / 30.4, Feb. 19, 2020, 3 pages total.

\* cited by examiner

CLOCK GENERATOR CIRCUIT FOR GENERATING DUTY CYCLE CLOCK SIGNALS AT LOW POWER

BACKGROUND

In many integrated circuits (ICs), clock signals that are used to operate components of the IC, including in connection with upconversion and downconversion of radio frequency (RF) signals, often are generated within the IC itself. Oftentimes, a clock generator receives an incoming clock signal and processes that clock signal to generate multiple clock signals having desired properties, such as different frequencies, duty cycles and so forth.

Particularly for generating local oscillator (LO) clock signals, careful design of clock generator components is needed in which high power consuming, closely matched devices such as various transistors, logic circuits and so forth are used. For example these components use relatively large devices to ensure clock signals are generated with desired specifications, including having low phase noise and a high level of matching between quadrature (IQ) signal paths. As such, relatively high power is consumed by these clock generators to output high-frequency LO clock signals having low phase noise and high level of matching.

SUMMARY OF THE INVENTION

In one aspect, an apparatus includes a clock generator circuit to receive a first clock signal at a first frequency and output a second clock signal at a second frequency less than the first clock frequency. The clock generator circuit may include: a divider circuit to divide the first clock signal to obtain at least a first divided clock signal and a second divided clock signal; and a gating circuit coupled to the divider circuit, the gating circuit to gate the first clock signal with at least one of the first divided clock signal and the second divided clock signal to output the second clock signal. A mixer is coupled to the clock generator circuit to downconvert a radio frequency (RF) signal using the second clock signal.

In an example, the gating circuit is to receive the first clock signal and gate the first clock signal with the first divided clock signal and gate the first clock signal with the second divided clock signal. The gating circuit may include a plurality of NAND gates, each of the plurality of NAND gates to receive the first clock signal and one of the first divided clock signal and the second divided clock signal. The gating circuit further may include a plurality of inverters, each of the plurality of inverters coupled to an output of one of the plurality of NAND gates. Each of the plurality of inverters outputs a phase of the second clock signal, the second clock signal comprising a differential quadrature clock signal.

In an example, the gating circuit comprises a first gating metal oxide semiconductor field effect transistor (MOSFET) and a second gating MOSFET, the first and second gating MOSFETs to be gated by the first divided clock signal, the first gating MOSFET having a first terminal coupled to a second terminal of a third MOSFET and the second gating MOSFET having a first terminal coupled to a first terminal of the third MOSFET, the third MOSFET to be gated by the first clock signal. The first gating MOSFET may have a first width-to-length ratio and the second gating MOSFET may have a second width-to-length ratio, the first width-to-length ratio greater than the second width-to-length ratio.

In an example, the first divided clock signal and the second divided clock signal comprise gating signals. A width of the second clock signal is defined by a width of the first clock signal and not defined by a width of the first divided clock signal or a width of the second divided clock signal. An edge rate of the second clock signal is defined by an edge rate of the first clock signal and not defined by an edge rate of the first divided clock signal or an edge rate of the second divided clock signal. In an example, a pulse width of the first divided clock signal is greater than a pulse width of the first clock signal, and a pulse width of the second clock signal is at least substantially equal to the pulse width of the first clock signal. The clock generator circuit may be a local oscillator circuit to generate quadrature 25% duty cycle clock signals comprising the second clock signal.

In another aspect, a method comprises: receiving, in a clock generator of an integrated circuit, an incoming clock signal; clocking a plurality of latches of a divider of the clock generator with the incoming clock signal to generate a plurality of intermediate clock signal phases; and gating the incoming clock signal with the plurality of intermediate clock signal phases to generate a local oscillator (LO) clock signal from the incoming clock signal, the LO clock signal having a reduced duty cycle with respect to the incoming clock signal.

In an example, the method further comprises outputting the LO clock signal to a mixer of the integrated circuit to downconvert an incoming radio frequency signal to a second frequency signal. The method may further include: latching a first latch of the divider with a first phase of the incoming clock signal and latching a second latch of the divider with a second phase of the incoming clock signal; and providing first output signals from the first latch to inputs of the second latch and providing second output signals from the second latch to inputs of the first latch. The method also may include: performing a logical operation between the first output signals and the second phase of the incoming clock signal to generate quadrature phases of the LO clock signal; and performing a logical operation between the second output signals and the first phase of the incoming clock signal to generate in-phase phases of the LO clock signal.

In yet another aspect, an integrated circuit comprises: a low noise amplifier (LNA) to receive and amplify a RF signal; a mixer coupled to the LNA to downconvert the RF signal to a second frequency signal using a LO clock signal; and a clock generator circuit to receive a first clock signal at a first frequency and output the LO clock signal, the LO clock signal having a duty cycle that is a fraction of a duty cycle of the first clock signal. The clock generator circuit may include: a divider circuit to divide the first clock signal to obtain a plurality of intermediate clock signals; and a gating circuit coupled to the divider circuit, the gating circuit to gate the first clock signal with the plurality of intermediate clock signals to generate the LO clock signal.

In an example, the gating circuit comprises: a plurality of logic gates, each of the plurality of logic gates to receive the first clock signal and one of the plurality of intermediate clock signals; and a plurality of inverters, each of the plurality of inverters coupled to an output of one of the plurality of logic gates. Each of the plurality of inverters is to output a phase of the LO clock signal, the LO clock signal comprising a differential quadrature clock signal. The clock generator circuit may generate the LO clock signal having an edge rate defined by an edge rate of the first clock signal and a pulse width at least substantially equal to a pulse width of the first clock signal, the pulse width of the LO clock signal greater than a pulse width of the plurality of intermediate clock signals.

DETAILED DESCRIPTION

In various embodiments, a clock generator is provided that may operate at low power (e.g., less than approximately 5 milliwatts) while still generating clock signals having desired signal properties, including superior IQ matching and low phase noise. In particular embodiments, this clock generator may be implemented within a local oscillator (LO) circuit that generates quadrature 25% duty cycle clock signals. These resulting clock signals can be used, e.g., in a mixer circuit such as a downconversion mixer that receives incoming differential RF signals and downconverts them to lower frequency signals.

With the low power operation, clock signals may be generated that have lower phase noise and higher speed for a given power budget. One example context of a use case is a wireless device such as an Internet of Things (IoT) integrated circuit. This wireless device includes a transceiver that may operate at frequencies of between, e.g., 2.4 gigahertz (GHz) and 2.5 GHz or between 4.9 GHz and 5.9 GHz. The 2.4 GHz to 2.5 GHz band, for example, is used for a Bluetooth transceiver, and the 4.9 GHz to 5.9 GHz band is used for a 5 GHz WiFi transceiver. Of course embodiments are not limited in this regard, and in other implementations a clock generator as described herein may be used in connection with transceivers operating up to, e.g., 10 GHz. To accommodate this transceiver, an LO circuit in accordance with an embodiment may generate LO clock signals that have a frequency of between approximately 2.4 GHz and 2.5 GHz.

Figure 1:
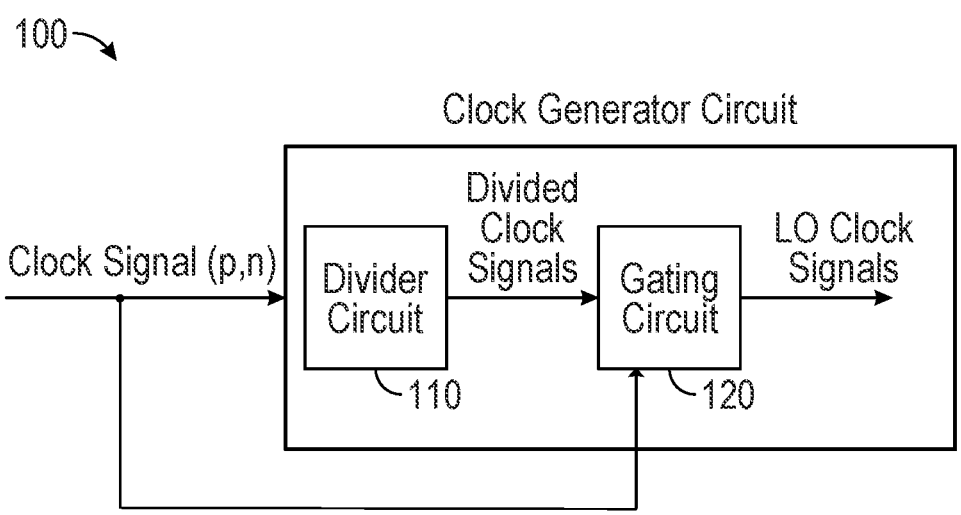
FIG. 1 is a block diagram of a clock generator circuit in accordance with an embodiment.

Referring now to FIG. 1, shown is a block diagram of a clock generator circuit in accordance with an embodiment. As shown in FIG. 1, clock generator circuit 100 receives an incoming clock signal. In implementations, this clock signal may be generated by an on-chip oscillator such as a voltage controlled oscillator (VCO). In the embodiment shown in FIG. 1, this clock signal is a differential signal having a positive phase portion (p) and a negative phase portion (n).

As shown, this differential clock signal is provided to a divider circuit 110. In embodiments, divider circuit 110 may operate to generate divided clock signals, e.g., four divided clock signals, from the incoming differential clock signal. In an embodiment, divider circuit 110 may be implemented with a plurality of latch circuits, as described further below.

In turn, resulting divided clock signals are provided to a gating circuit 120 which also receives the incoming differential clock signal. In embodiments herein, gating circuit 120 may gate the incoming differential clock signal using these divided clock signals, to generate one or more LO clock signals. The LO clock signals may have substantially the same shape as the VCO clock signal, but at a lower duty cycle, e.g., a 25% duty cycle. As such the LO clock signals may have at least substantially the same pulse width as the VCO clock signal, but are generated at a lower frequency.

Within gating circuit 120, the divided clock signals act as gating signals to the high-speed incoming (e.g., VCO) clock signal and do not define either a width or an edge rate of a resulting LO clock signal. As a result, these gating signals have relaxed design requirements, with the only true requirement being that the divided clock signal does not transition while the incoming clock signal (namely the signal to be gated) is high or transitioning (from low-to-high or from high-to-low). As a result of this lack of requirements, divider circuit 110 can be designed with a lower power budget. Or divider circuit 110 can operate at higher speeds for a given power budget as its matching and edge rate are not critical. This is so, as the divided clock signals do not define overall matching and do not contribute to phase noise of resulting LO signals. Thus better matching and lower phase noise can be realized for a given power budget. That is, for a given power budget, lower clock jitter may be realized due to a lower number of gates that an LO edge-defining clock passes through. Further, due to this lower number of gates, lower mismatch results are achieved, resulting in higher native image rejection. Still further, faster potential maximum operating speeds can be realized since the intermediate clock signals generated by divider circuit 110 do not define LO signal width or edge rates.

Figure 2A:
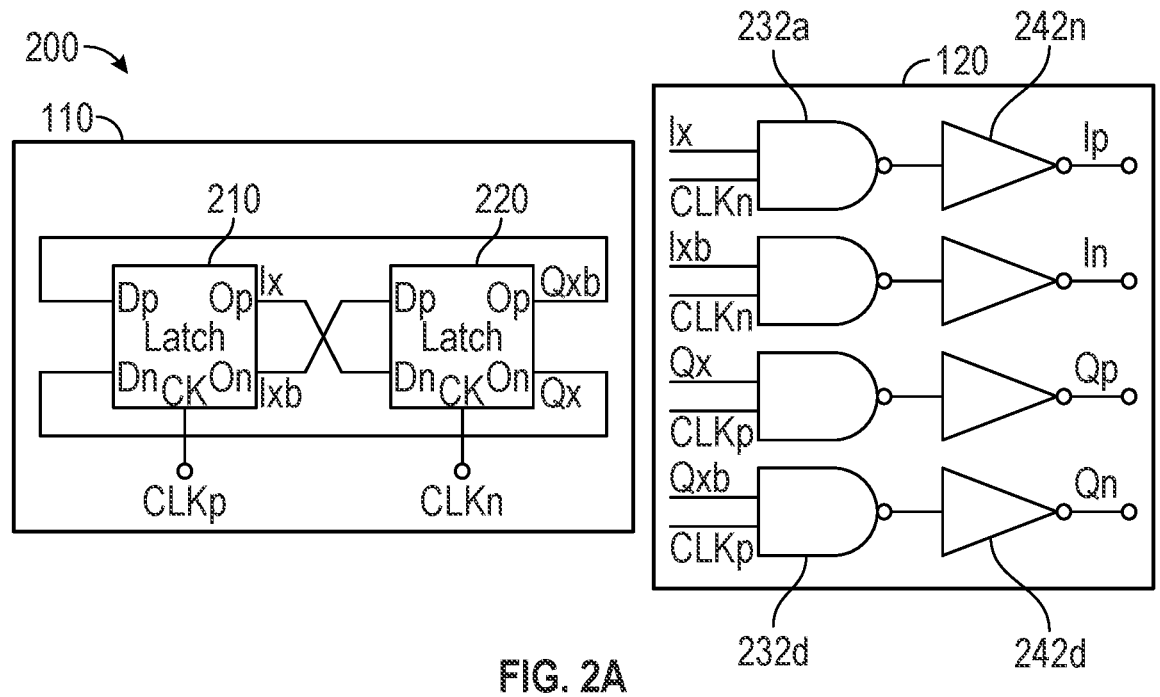
FIG. 2A is a schematic diagram of a clock generator circuit in accordance with an embodiment.

Referring now to FIG. 2A, shown is a schematic diagram of a clock generator circuit in accordance with an embodiment. As shown in FIG. 2A, clock generator circuit 200 may include divider circuit 110 and gating circuit 120 of FIG. 1. As illustrated, divider circuit 110 includes a plurality of latch circuits 210, 220, which may be implemented as D-type latches. As shown, each latch circuit 210, 220 is clocked by one of the phases of the differential clock signal (CLKn, CLKp). The outputs of latch circuit 210 are cross-coupled to the inputs of latch circuit 220. And in turn, the outputs of latch circuit 220 are fed back to the inputs of latch circuit 210. These outputs are the divided clock signal phases, also referred to herein as intermediate clock signals.

The resulting outputs of latch circuits 210, 220 (namely divided clock signals Ix, Ixb, Qx, Qxb) are in turn provided as inputs to gating circuit 120, shown in further detail in FIG. 2A. As shown in FIG. 2A, gating circuit 120 receives the divided clock signal phases and the incoming differential clock signal in a plurality of logic gates, namely NAND gates 232*a-d*. More specifically, each NAND gate 232 receives a phase of the incoming clock signal and one of the divided clock signal phases. In turn, each NAND gate 232 provides an output signal to a corresponding inverter 242*a-d*. In this way gating circuit 120 operates to gate the incoming differential clock signal with the divided clock signal phases, thus reducing reliance on matching or pulse width control of the divided clock signals. While shown with this particular set of logic gates, in other implementations other logic gate configurations such as AND or NOR gates may be used.

Figure 2B:
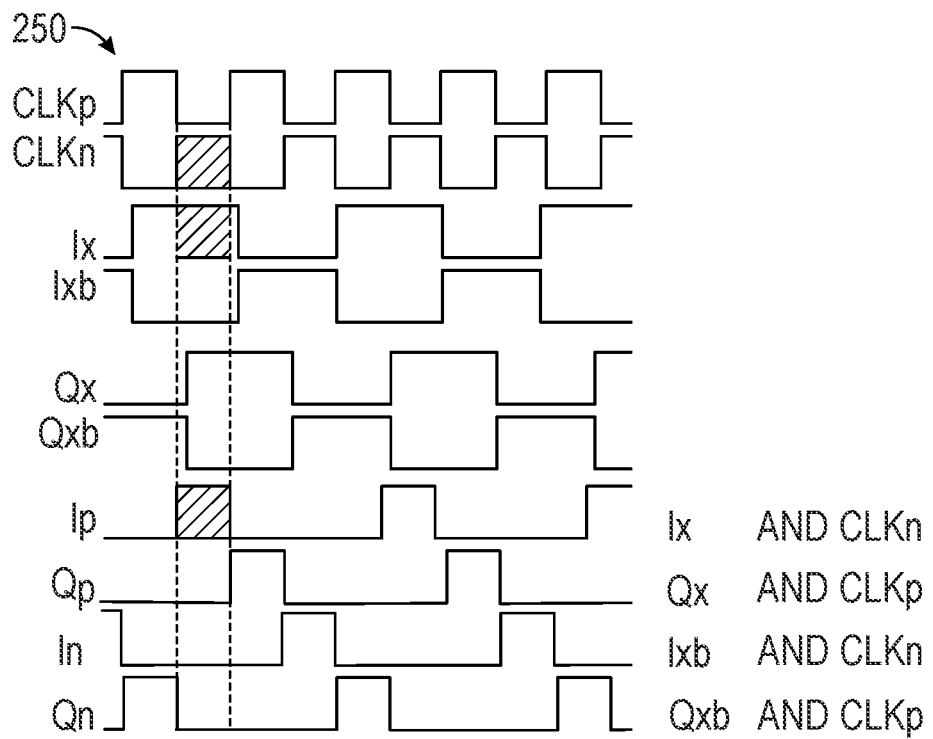
FIG. 2B is a timing diagram of operation of a clock generator circuit in accordance with an embodiment.

Referring now to FIG. 2B, shown is a timing diagram 250, which illustrates the operation of clock generator circuit 200. As seen, the incoming differential clock signal CLKp, CLKn is provided as an input that is used to clock latches of a divider circuit. These latches in turn output a plurality of divided clock signal phases Ix, Ixb, Qx, Qxb. While a divide by two operation is shown, understand that the input of the divider might be generated from additional dividers placed at the VCO output. For a 25% duty-cycle quadrature LO generator, the incoming clock signal is a 50% duty cycle signal. Therefore, typically even integer divide ratios are used (e.g., 6, 8, 10). Note that due to mismatches in devices of the latches, phase noise and so forth, these divided clock signal phases do not fully align with the transitions in the input clock signal. Instead in embodiments, there may be a delay, for example, of up to approximately 20 percent of the input clock period. The actual delay amount is mainly set by the transistor drive strength and parasitic capacitors of the implemented latches. In addition, while shown with relatively sharp edges in FIG. 2B, again due to use of smaller sized devices, these divided clock signal phases may not maintain sharp rectangular waveforms.

Still referring to FIG. 2B, when provided to a gating circuit such as gating circuit 120, these divided clock signal phases are used to gate the incoming differential clock signal, by way of logical ANDing (as shown in FIG. 2B), resulting in second clock signals (Ip, In, Qp, Qn), each having a 25% duty cycle with respect to the incoming clock signal. Understand while shown with this particular implementation in FIG. 2B, other implementations are possible to realize a similar 25% duty cycle of clock signal generation. Of course other duty cycles and logic circuit implementations are possible in other embodiments.

Figure 3A:
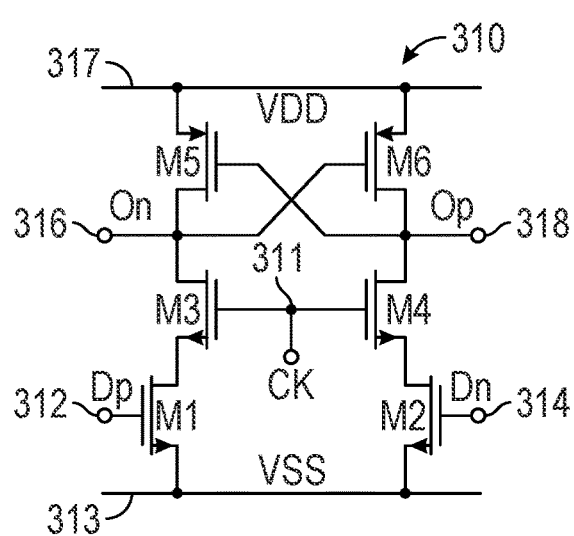
FIG. 3A is a schematic diagram of a latch circuit in accordance with an embodiment.

Referring now to FIG. 3A, shown is a schematic diagram of an example latch circuit in accordance with an embodiment. In the implementation of FIG. 3A, latch circuit 310 may be a pseudo-differential latch circuit having a load formed of P-type metal oxide semiconductor field effect transistors (MOSFETs).

As shown, incoming differential data signals Dp, Dn are provided via input nodes 312, 314, each of which is coupled to a corresponding gate terminal of an N-type MOSFET (NMOS) device. Specifically as shown, a positive input data signal Dp is coupled to a gate terminal of NMOS device M1 at input node 312, and a negative input data signal Dn is coupled to a gate terminal of NMOS device M2 at input node 314.

NMOS devices M1, M2 have source terminals coupled to a reference voltage node 313 and drain terminals in turn coupled to source terminals of corresponding NMOS devices M3, M4. As shown, commonly coupled gate terminals of MOSFETs M3, M4 receive a clock signal CK at a clock node 311. In turn, the drain terminals of NMOS devices M3, M4 couple to output nodes 316, 318 to provide corresponding output signals On, Op (which may be used as divided clock signals and may also be provided as inputs to another latch circuit of a divider circuit as described herein). As further shown output nodes 316, 318 further couple to drain terminals of P-type MOSFET (PMOS) devices M5, M6 having gate terminals cross-coupled to output nodes 316, 318 and having source terminals coupled to a supply voltage node 317. Note that the MOSFETs of latch circuit 310 can tolerate large mismatches and higher noise, therefore may be relatively small devices since the resulting divided clock signals are used as gating signals.

Although shown with this implementation, of course other implementations are possible. In the implementation shown in FIG. 3A, the incoming clock signal (e.g., a VCO clock) is received at a top of the data inputs received at input nodes 312, 314. Instead in other embodiments it is possible to receive a clock below data input nodes.

Figure 3B:
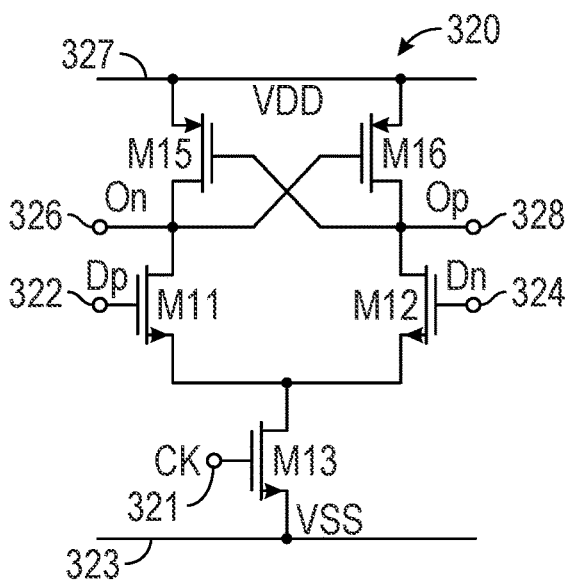
FIG. 3B is a schematic diagram of a latch circuit in accordance with another embodiment.

Referring now to FIG. 3B, shown is a schematic diagram of a latch circuit in accordance with another embodiment. As shown, latch circuit 320 receives an incoming clock signal, e.g., a VCO clock, at a clock node 321 coupled to an NMOS device M13 having a source terminal coupled to a reference voltage node 323 and a drain terminal coupled to source terminals of NMOS devices M11 and M12. With this arrangement having a single device to receive the incoming clock signal, there is less loading to a VCO or other clock source, enabling potentially faster operation.

As further shown in FIG. 3B, incoming differential data signals Dp, Dn are provided via input nodes 322, 324, each of which is coupled to a corresponding gate terminal of respective NMOS devices M11, M12. In turn, NMOS devices M11, M12 have drain terminals coupled to drain terminals of corresponding PMOS devices M15, M16, also coupled to output nodes 326, 328 to provide corresponding output signals On, Op (which may be used as divided clock signals and may also be provided as inputs to another latch circuit of a divider circuit as described herein). As further shown PMOS devices M15, M16 have gate terminals cross-coupled to output nodes 326, 328 and source terminals coupled to a supply voltage node 327. Note that the MOSFETs of latch circuit 320 can have relatively large mismatches and may be relatively small devices as described above with respect to FIG. 3A.

Figure 3C:
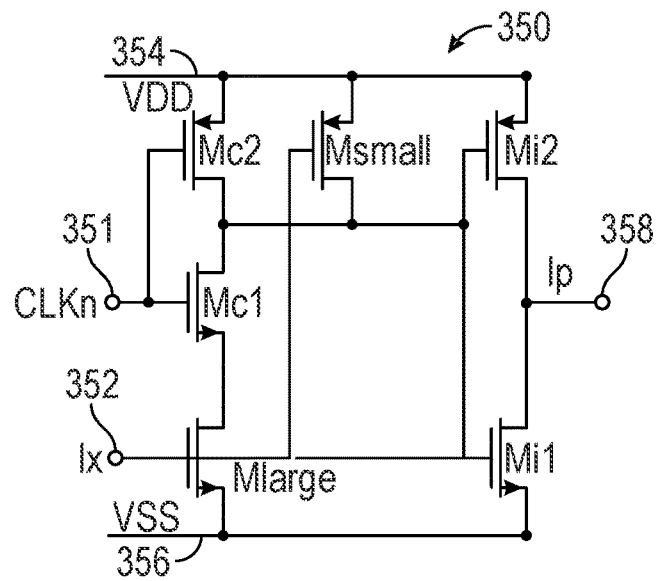
FIG. 3C is a schematic diagram of a gating circuit in accordance with an embodiment.

Referring now to FIG. 3C, shown is a schematic diagram of a gating circuit in accordance with an embodiment. As shown in FIG. 3C, gating circuit 350 may be used to gate an incoming clock signal (CLKn) with intermediate clock phases, which may be generated by a divider circuit. As one example, gating circuit 350 may be a representative implementation of gating circuit 120.

As shown, incoming clock signal CLKn is received via an input clock node 351 coupled to gate terminals of corresponding NMOS device Mc1 and PMOS device Mc2. The source terminal of NMOS device Mc1 is coupled to a drain terminal of a gating NMOS device Mlarge. As shown, this gating NMOS device Mlarge has a gate terminal coupled to receive an intermediate clock signal phase Ix via an input node 352 and a source terminal coupled to a reference voltage node 356.

NMOS device Mc1 further has a drain terminal coupled to a drain terminal of PMOS device Mc2, and PMOS device Mc2 has a source terminal coupled to a supply voltage node 354. As illustrated, the commonly coupled drain terminals of NMOS device Mc1 and PMOS device Mc2 further couple to a drain terminal of a gating PMOS device Msmall.

As illustrated, this gating PMOS device Msmall further has a gate terminal coupled to receive the divided clock signal phase via input node 352 and a source terminal coupled to supply voltage node 354. In turn, its drain terminal also couples to corresponding gate terminals of inverter PMOS device Mi2 and NMOS device Mi1. These inverter devices have commonly coupled drain terminals that provide a resulting 25% duty cycle clock signal Ip at an output node 358. As further shown, inverter NMOS device Mi1 has a source terminal coupled to reference voltage node 356, and inverter PMOS device Mi2 has a source terminal coupled to supply voltage node 354.

With this arrangement of gating circuit 350 gating NMOS device Mlarge may have a relatively large ratio of width-to-length (W/L) for better edge rate performance. In embodiments, this gating NMOS device may have a W/L ratio between approximately two and four times that of Mc1. Similarly, for less loading and thus better edge rate gating, gating PMOS device Msmall may have a smaller W/L ratio, e.g., between approximately one-fourth and one-half that of Mc2. Understand while shown with this particular implementation in the embodiment of FIG. 3C, many variations and alternatives are possible.

Figure 3D:
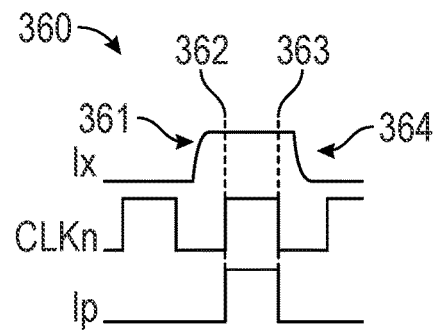
FIG. 3D is a timing diagram of operation of a gating circuit in accordance with an embodiment.

Referring now to FIG. 3D, shown is a timing diagram 360 of the operation of gating circuit 350. As illustrated, an incoming divided clock signal phase Ix has a relatively slow rise with a relatively non-sharp edge, as illustrated at rising portion 361. Further, this divided clock signal, which is used as a gating signal, has a period that does not fully align with the incoming clock signal CLKn. As shown, a rising edge 362 and a falling edge 363 of incoming clock signal CLKn do not align with corresponding rising portion 361 and falling portion 364 of the divided clock signal. Nevertheless, by using an embodiment herein, a resulting output clock signal, Ip, maintains sufficiently identical shape (pulse width and edges) and phase as the incoming clock signal CLKn.

Figure 4:
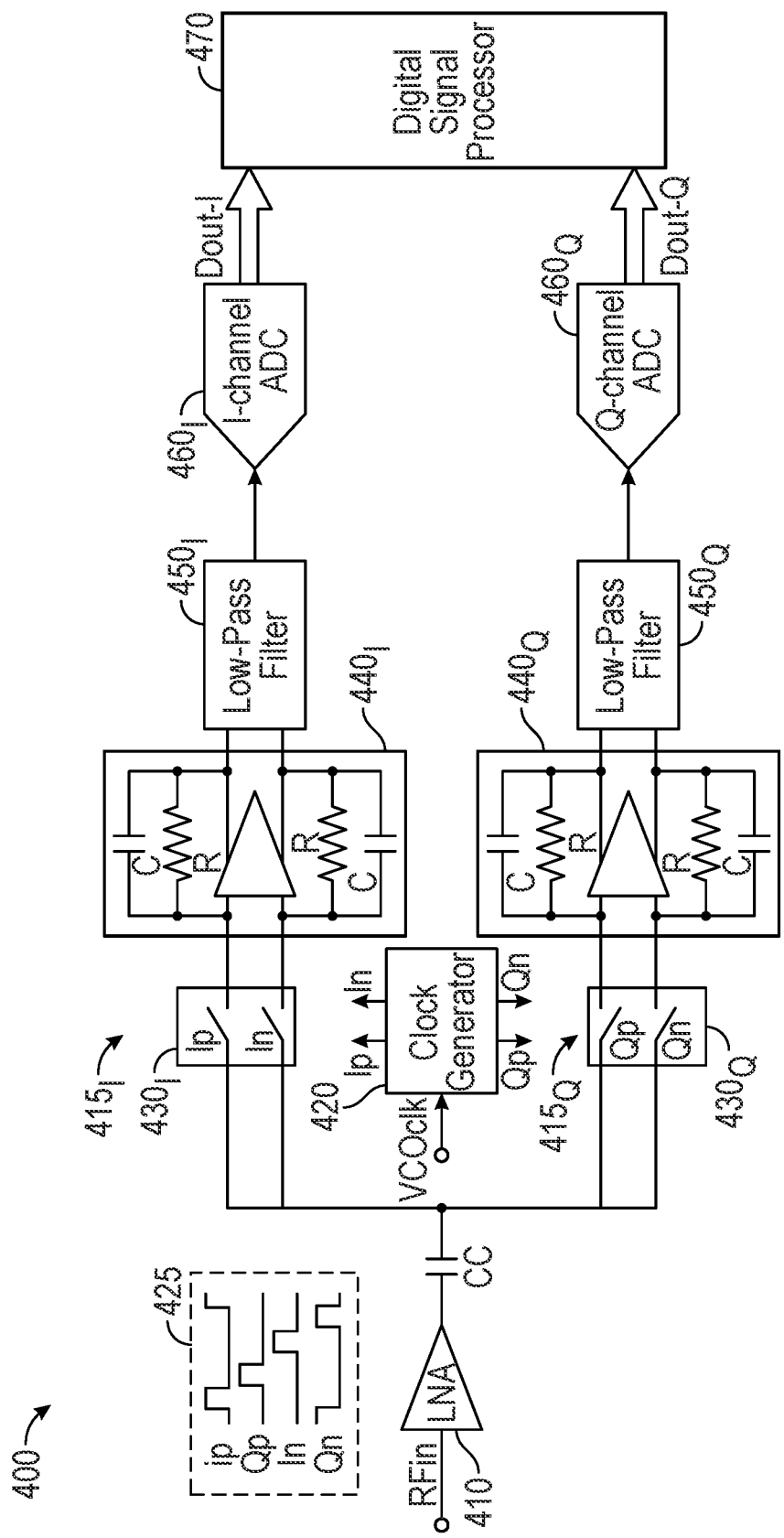
FIG. 4 is a high level block diagram of a portion of a receiver in accordance with an embodiment.

Referring now to FIG. 4, shown is a high level block diagram of a portion of a receiver in accordance with an embodiment. As shown in FIG. 4, receiver 400, which may be any type of IC including RF capabilities, includes a low noise amplifier (LNA) 410 to receive an incoming RF signal RFin, which may be received from an off-chip antenna. After amplification in LNA 410, the resulting amplified RF signal is coupled via a coupling capacitor CC to signal processing paths $415_I$, $415_Q$ each having a current-driven passive mixer $430_I$ and $430_Q$ formed by switches. As shown, mixers $430_I$, $430_Q$ include corresponding 180 degree out of phase controlled switches. While shown as a relatively simple switch arrangement, understand that a differential mixer may take various forms. As shown, mixers $430_{I,Q}$ may be clocked using 25% quadrature LO clock signals received from a clock generator 420, which may be an IQ LO clock generator in accordance with an embodiment. For example, clock generator 420 may include divider circuit 110 and gating circuit 120 as described above (and which may include the particular implementations described in FIGS. 3A (and/or 3B) and 3C). The resulting 25% quadrature LO clock signals are shown in inset 425. As such, passive mixers 430 downconvert the incoming RF signals to lower frequency signals, e.g., intermediate frequency (IF) or to baseband (zero-IF).

In turn, the resulting downconverted current signals are provided to corresponding transimpedance amplifiers (TIAs) $440_I$, $440_Q$, with RC circuits coupled between inputs and outputs of the TIAs to convert the incoming current signals into voltage signals. These gain controlled signals are provided to low pass filters $450_I$, $450_Q$ and in turn to digitizers $460_I$, $460_Q$, which may be implemented as analog-to-digital converters. The resulting digital signals ($D_{out-I}$ and $D_{out-Q}$), which may be at baseband, are provided in turn to a digital signal processor 470. Digital signal processor 470 may perform various processing on the signals to obtain message content. Understand while shown at this high level in the embodiment of FIG. 4, many variations and alternatives are possible. Note that in embodiments, all the circuitry shown in FIG. 4 may be implemented on a single semiconductor die of an integrated circuit.

Figure 5:
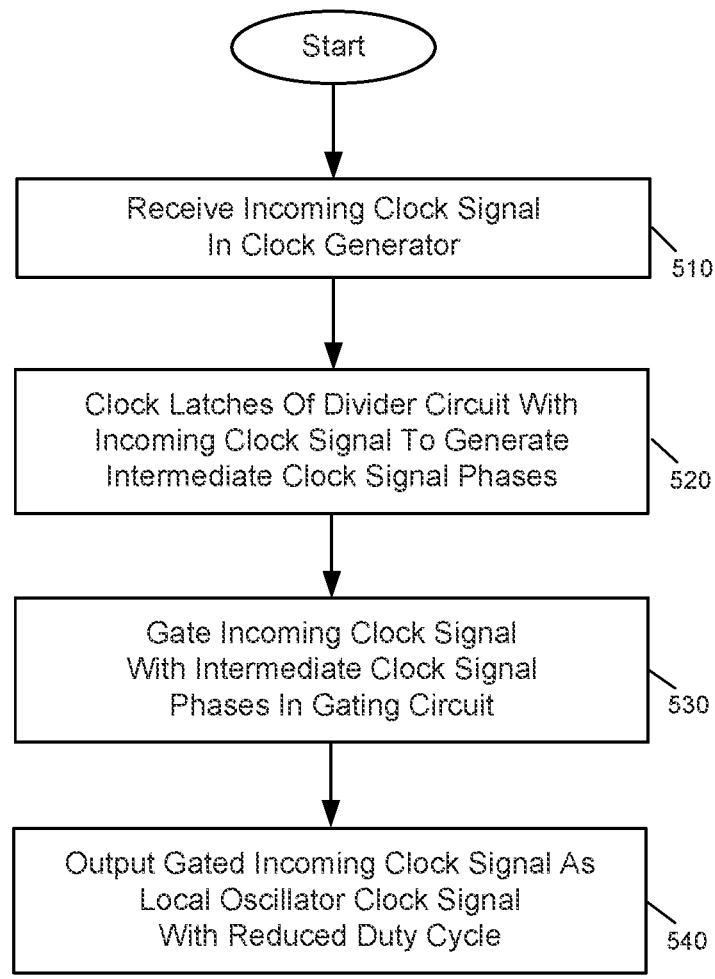
FIG. 5 is a flow diagram of a method in accordance with an embodiment.

Referring now to FIG. 5, shown is a flow diagram of a method in accordance with an embodiment. As shown in FIG. 5, method 500 is a method for generating clock signals in a low power clock generator circuit as described herein. As such, method 500 may be performed within the clock generator circuit, which may be configured for particular operating characteristics (e.g., pulse width, duty cycle, frequency and so forth), e.g., based at least in part on a frequency band of wireless operation.

As illustrated, method 500 begins by receiving an incoming clock signal in the clock generator (block 510). This incoming clock signal may be a differential VCO clock signal, and in implementations may be a VCO clock signal that is a square wave having a frequency of between approximately 1 and 10 GHz.

Still with reference to FIG. 5, next at block 520 latches of a divider circuit can be clocked with this incoming clock signal. In this manner, a plurality of intermediate clock signal phases may be generated within the divider circuit. For example, with an incoming differential clock signal, 4 intermediate clock signal phases may be generated. While these intermediate clock signal phases may have different characteristics depending upon desired operation characteristics, in some cases the divider circuit may perform a divide by 2 operation, such that the resulting intermediate quadrature clock signals are at 50% of the frequency of the incoming clock signal. Of course other examples are possible. Further note that as described herein, these intermediate clock signal phases may be generated in a low power manner such that the resulting signals can tolerate relatively large amounts of noise and device mismatch.

Next at block 530 the incoming clock signal may be gated with these intermediate clock signal phases in a gating circuit. As such, these intermediate clock signal phases, which have some amount of noise and other undesired characteristics, act as gating signals, such that the resulting gated incoming clock signal maintains the signal integrity of the original incoming clock signal, albeit at a reduced duty cycle (e.g., 25%).

Finally, at block 540 the gated incoming clock signal may be output as a quadrature LO clock signal (i.e., 90 degrees phase shift between Ip and Qp or between In and Qn) with the reduced duty cycle. In embodiments as described herein, this LO clock signal may be used by a downconversion mixer that receives an RF signal and downconverts it to a lower frequency signal. Understand while shown at this high level in the embodiment of FIG. 5, many variations and alternatives are possible.

Figure 6:
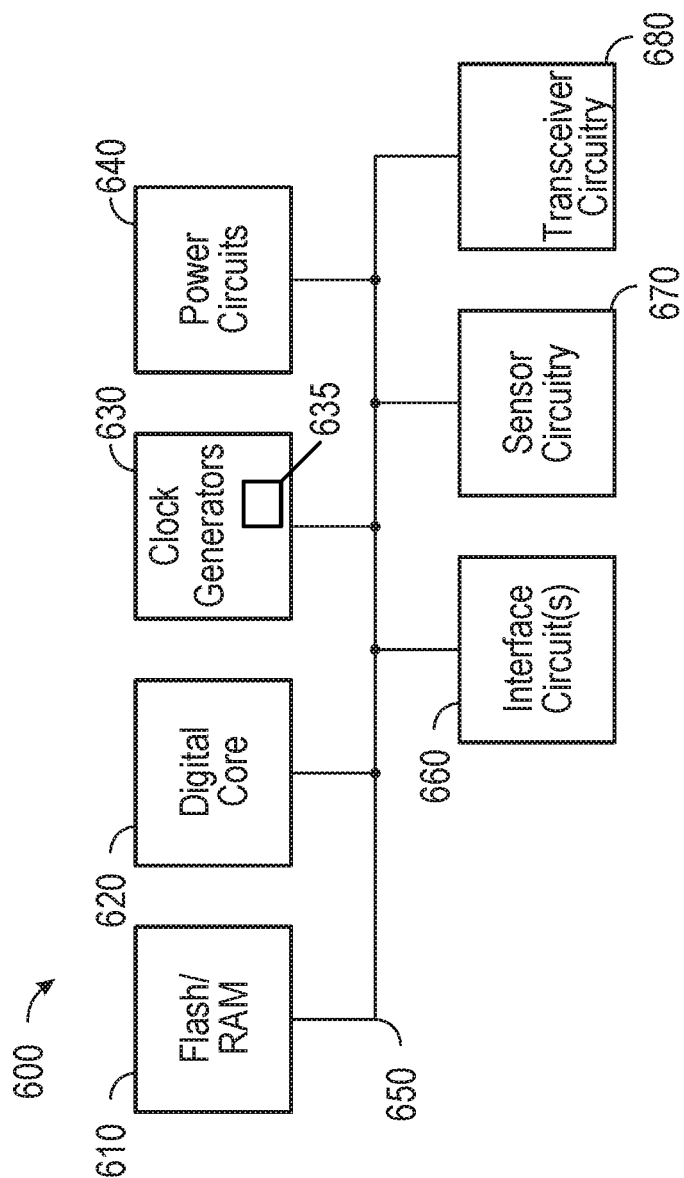
FIG. 6 is a block diagram of a representative integrated circuit in accordance with an embodiment.

Referring now to FIG. 6, shown is a block diagram of a representative integrated circuit 600 which may include clock generator circuitry as described herein. In the embodiment shown in FIG. 6, integrated circuit 600 may be, e.g., a microcontroller, wireless transceiver or other device that can be used in a variety of use cases, including sensing, metering, monitoring, embedded applications, communications, applications and so forth, and which may be particularly adapted for use in an IoT device.

In the embodiment shown, integrated circuit 600 includes a memory system 610 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions, including instructions for controlling operation of a clock generator, e.g., based on a desired channel of operation as described herein.

Memory system 610 couples via a bus 650 to a digital core 620, which may include one or more cores and/or microcontrollers that act as a main processing unit of the integrated circuit. In turn, digital core 620 may couple to clock generators 630 which may provide one or more phase locked loops or other clock generator circuitry to generate various clocks for use by circuitry of the IC. As shown, clock generators 630 may include a clock generator 635, which may generate LO clock signals via gating of an incoming clock signal as described herein.

As further illustrated, IC 600 further includes power circuitry 640, which may include one or more voltage regulators. Additional circuitry may optionally be present depending on particular implementation to provide various functionality and interaction with external devices. Such circuitry may include interface circuitry 660 which may provide interface with various off-chip devices, sensor circuitry 670 which may include various on-chip sensors including digital and analog sensors to sense desired signals, such as for a metering application or so forth.

In addition as shown in FIG. 6, transceiver circuitry 680 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. Understand while shown with this high level view, many variations and alternatives are possible.

Note that ICs such as described herein may be implemented in a variety of different devices such as IoT device. This IoT device may be a smart utility meter for use in a smart utility network, e.g., a mesh network in which communication is according to an IEEE 802.15.4 specification.

Figure 7:
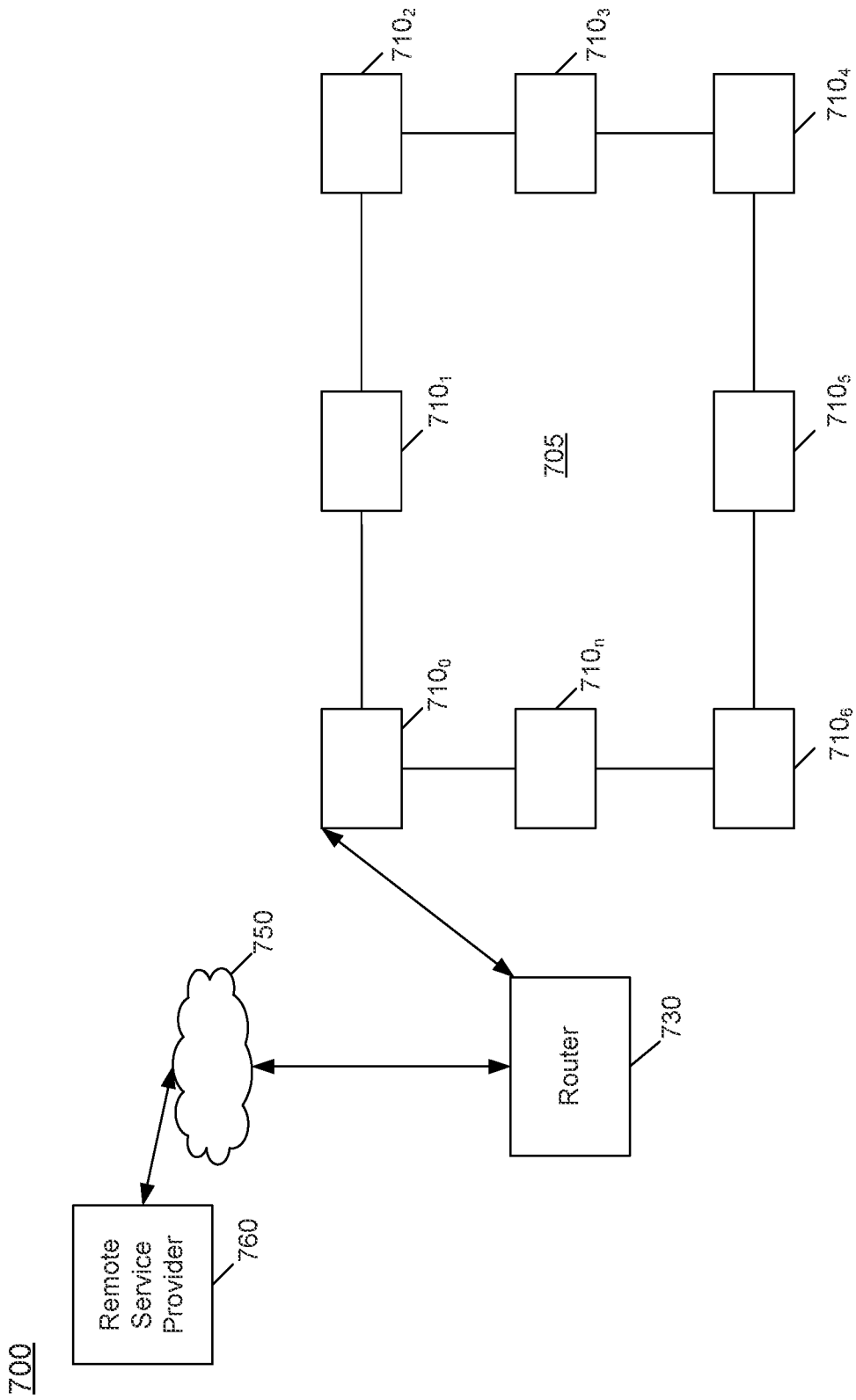
FIG. 7 is a high level diagram of a network in accordance with an embodiment.

Referring now to FIG. 7, shown is a high level diagram of a network in accordance with an embodiment. As shown in FIG. 7, a network 700 includes a variety of devices, including smart devices such as IoT devices, routers and remote service providers. In the embodiment of FIG. 7, a mesh network 705 may be present, e.g., in a neighborhood having multiple IoT devices $710_{0-n}$. Such IoT devices may generate LO and other clock signals in a low power manner via gating as described herein. As shown, at least one IoT device 710 couples to a router 730 that in turn communicates with a remote service provider 760 via a wide area network 750, e.g., the internet. In an embodiment, remote service provider 760 may be a backend server of a utility that handles communication with IoT devices 710. Understand while shown at this high level in the embodiment of FIG. 7, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a clock generator circuit to receive a first clock signal at a first frequency and output a second clock signal at a second frequency less than the first clock frequency, the clock generator circuit including:
        a divider circuit to divide the first clock signal to obtain at least a first divided clock signal and a second divided clock signal; and
        a gating circuit coupled to the divider circuit, the gating circuit to gate the first clock signal with at least one of the first divided clock signal and the second divided clock signal to output the second clock signal; and
    a mixer coupled to the clock generator circuit to down-convert a radio frequency (RF) signal using the second clock signal.

2. The apparatus of claim 1, wherein the gating circuit is to receive the first clock signal and gate the first clock signal with the first divided clock signal and gate the first clock signal with the second divided clock signal.

3. The apparatus of claim 1, wherein the gating circuit comprises a plurality of NAND gates, each of the plurality of NAND gates to receive the first clock signal and one of the first divided clock signal and the second divided clock signal.

4. The apparatus of claim 3, wherein the gating circuit further comprises a plurality of inverters, each of the plurality of inverters coupled to an output of one of the plurality of NAND gates.

5. The apparatus of claim 4, wherein each of the plurality of inverters is to output a phase of the second clock signal, the second clock signal comprising a differential quadrature clock signal.

6. The apparatus of claim 4, wherein the gating circuit comprises:
    a first gating metal oxide semiconductor field effect transistor (MOSFET) and a second gating MOSFET, the first and second gating MOSFETs to be gated by the first divided clock signal, the first gating MOSFET having a first terminal coupled to a second terminal of a third MOSFET and the second gating MOSFET having a first terminal coupled to a first terminal of the third MOSFET, the third MOSFET to be gated by the first clock signal.

7. The apparatus of claim 6, wherein the first gating MOSFET has a first width-to-length ratio and the second gating MOSFET has a second width-to-length ratio, the first width-to-length ratio greater than the second width-to-length ratio.

8. The apparatus of claim 1, wherein the first divided clock signal and the second divided clock signal comprise gating signals.

9. The apparatus of claim 8, wherein a width of the second clock signal is defined by a width of the first clock signal and not defined by a width of the first divided clock signal or a width of the second divided clock signal.

10. The apparatus of claim 9, wherein an edge rate of the second clock signal is defined by an edge rate of the first clock signal and not defined by an edge rate of the first divided clock signal or an edge rate of the second divided clock signal.

11. The apparatus of claim 1, wherein a pulse width of the first divided clock signal is greater than a pulse width of the first clock signal, and a pulse width of the second clock signal is at least substantially equal to the pulse width of the first clock signal.

12. The apparatus of claim 1, wherein the clock generator circuit comprises a local oscillator circuit to generate quadrature 25% duty cycle clock signals comprising the second clock signal.

13. A method comprising:
    receiving, in a clock generator of an integrated circuit, an incoming clock signal;
    clocking a plurality of latches of a divider of the clock generator with the incoming clock signal to generate a plurality of intermediate clock signal phases; and gating the incoming clock signal with the plurality of intermediate clock signal phases to generate a local oscillator (LO) clock signal from the incoming clock signal, the LO clock signal having a reduced duty cycle with respect to the incoming clock signal.

14. The method of claim 13, further comprising outputting the LO clock signal to a mixer of the integrated circuit to downconvert an incoming radio frequency signal to a second frequency signal.

15. The method of claim 13, further comprising:
latching a first latch of the divider with a first phase of the incoming clock signal and latching a second latch of the divider with a second phase of the incoming clock signal; and
providing first output signals from the first latch to inputs of the second latch and providing second output signals from the second latch to inputs of the first latch.

16. The method of claim 15, further comprising:
performing a logical operation between the first output signals and the second phase of the incoming clock signal to generate quadrature phases of the LO clock signal; and
performing a logical operation between the second output signals and the first phase of the incoming clock signal to generate in-phase phases of the LO clock signal.

17. An integrated circuit comprising:
a low noise amplifier (LNA) to receive and amplify a radio frequency (RF) signal;
a mixer coupled to the LNA to downconvert the RF signal to a second frequency signal using a local oscillator (LO) clock signal; and
a clock generator circuit to receive a first clock signal at a first frequency and output the LO clock signal, the LO clock signal having a duty cycle that is a fraction of a duty cycle of the first clock signal, the clock generator circuit including:
a divider circuit to divide the first clock signal to obtain a plurality of intermediate clock signals; and
a gating circuit coupled to the divider circuit, the gating circuit to gate the first clock signal with the plurality of intermediate clock signals to generate the LO clock signal.

18. The integrated circuit of claim 17, wherein the gating circuit comprises:
a plurality of logic gates, each of the plurality of logic gates to receive the first clock signal and one of the plurality of intermediate clock signals; and
a plurality of inverters, each of the plurality of inverters coupled to an output of one of the plurality of logic gates.

19. The integrated circuit of claim 18, wherein each of the plurality of inverters is to output a phase of the LO clock signal, the LO clock signal comprising a differential quadrature clock signal.

20. The integrated circuit of claim 17, wherein the clock generator circuit is to generate the LO clock signal having an edge rate defined by an edge rate of the first clock signal and a pulse width at least substantially equal to a pulse width of the first clock signal, the pulse width of the LO clock signal greater than a pulse width of the plurality of intermediate clock signals.

* * * * *